(12) United States Patent
Lin et al.

(10) Patent No.: US 6,800,910 B2
(45) Date of Patent: Oct. 5, 2004

(54) FINFET DEVICE INCORPORATING STRAINED SILICON IN THE CHANNEL REGION

(75) Inventors: Ming-Ren Lin, Cupertino, CA (US); Jung-Suk Goo, Stanford, CA (US); Haihong Wang, Fremont, CA (US); Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/335,474

(22) Filed: Dec. 31, 2002

(65) Prior Publication Data

US 2004/0061178 A1 Apr. 1, 2004

Related U.S. Application Data

(60) Provisional application No. 60/415,226, filed on Sep. 30, 2002.

(51) Int. Cl.[7] ............................................. H01L 27/105
(52) U.S. Cl. ...................... 257/410; 257/411; 257/412; 257/413; 257/347
(58) Field of Search ................................. 257/410, 411, 257/412, 413, 347

(56) References Cited

U.S. PATENT DOCUMENTS

| | | | | |
|---|---|---|---|---|
| 6,413,802 B1 | * | 7/2002 | Hu et al. | 438/151 |
| 6,475,869 B1 | * | 11/2002 | Yu | 438/303 |
| 6,562,665 B1 | * | 5/2003 | Yu | 438/149 |
| 6,611,029 B1 | * | 8/2003 | Ahmed et al. | 257/365 |
| 6,635,909 B2 | * | 10/2003 | Clark et al. | 257/192 |

* cited by examiner

Primary Examiner—Nathan J. Flynn
Assistant Examiner—Pershelle Greene
(74) Attorney, Agent, or Firm—Foley & Lardner LLP (57) ABSTRACT

A FinFET device employs strained silicon to enhance carrier mobility. In one method, a FinFET body is patterned from a layer of silicon germanium (SiGe) that overlies a dielectric layer. An epitaxial layer of silicon is then formed on the silicon germanium FinFET body. A strain is induced in the epitaxial silicon as a result of the different dimensionalities of intrinsic silicon and of the silicon germanium crystal lattice that serves as the template on which the epitaxial silicon is grown. Strained silicon has an increased carrier mobility compared to relaxed silicon, and as a result the epitaxial strained silicon provides increased carrier mobility in the FinFET. A higher driving current can therefore be realized in a FinFET employing a strained silicon channel layer.

30 Claims, 9 Drawing Sheets

FINFET DEVICE INCORPORATING STRAINED SILICON IN THE CHANNEL REGION

RELATED APPLICATIONS

This application claims priority under 35 U.S.C. §119(e) from U.S. Provisional Patent Application Ser. No. 60/415,226, filed Sep. 30, 2002.

BACKGROUND OF THE INVENTION

1. Field of the Invention

The invention pertains to semiconductor devices, and more particularly to vertical double gate MOSFETs, also known as FinFETs.

2. Related Technology

Metal oxide semiconductor field effect transistors (MOSFETs) are the primary component of most semiconductor devices. The conventional MOSFET is constructed from a semiconductor substrate in which dopant-implanted active regions are formed. As a result, the active components of the MOSFET are surrounded by semiconductor material. However, as channel lengths are reduced to less than 100 nm, the use of semiconductor substrate construction in MOSFETs creates performance degrading phenomena such as short channel effect. The short channel effect degrades the ability of the MOSFET gate to control conductivity in the MOSFET channel region due to interactions of the source and drain regions that occur as a result of the semiconductor materials of the semiconductor substrate that surround the active regions.

An alternative to the conventional semiconductor substrate construction is silicon on insulator (SOI) construction. In SOI construction, devices such as MOSFETS are formed as monolithic semiconductor structures supported on a dielectric substrate, rather than as regions formed within a semiconductor substrate. SOI devices have been found to have a number of advantages over devices formed using semiconductor substrate construction, such as better isolation between devices, reduced leakage current, reduced latch-up between CMOS elements, reduced chip capacitance, and reduction or elimination of short channel coupling between source and drain regions.

Figure 1A:
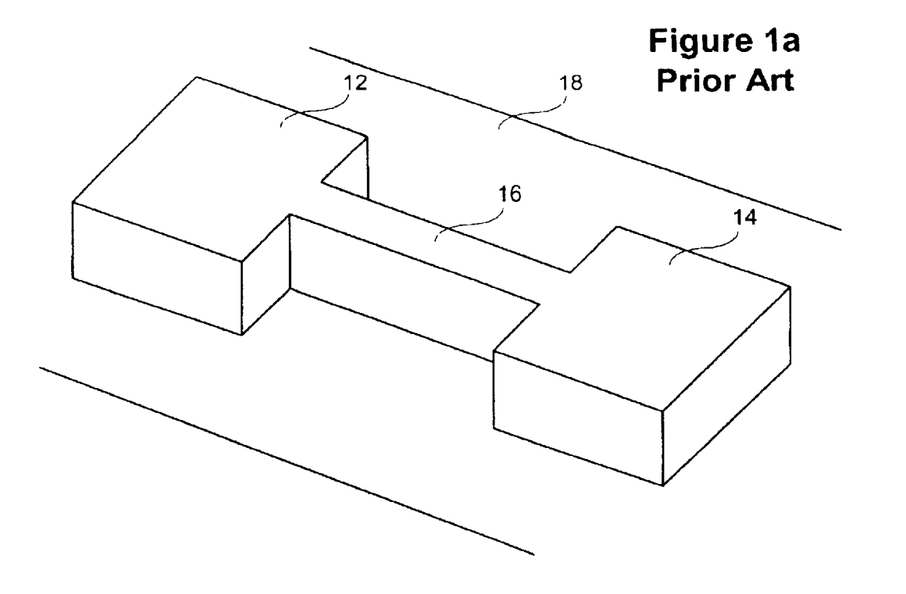
FIG. 1a shows a body portion of a conventional FinFET.
Figure 1B:
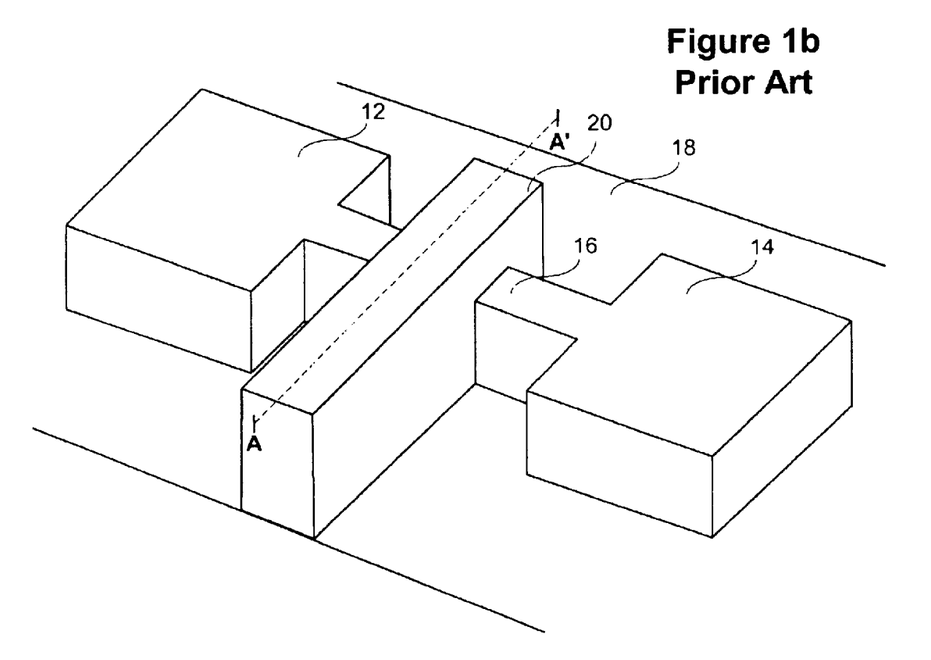
Figure 2:
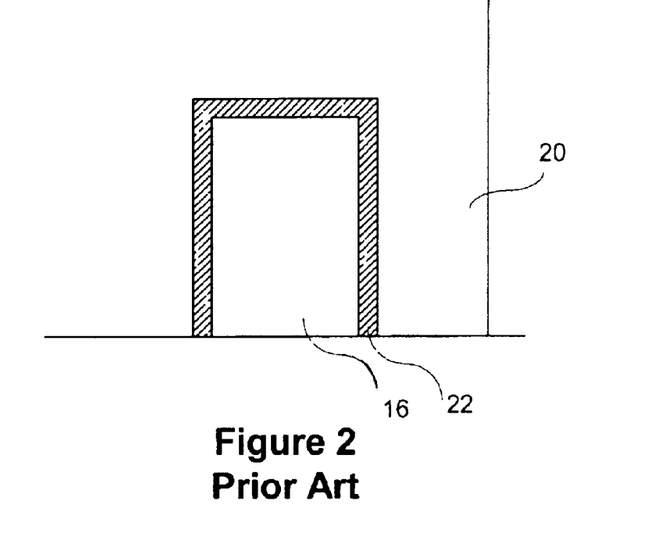

One type of MOSFET structure that is formed using SOI construction is conventionally known as a vertical double-gate MOSFET, or a FinFET. As shown in FIG. 1a, the FinFET is constructed from a silicon body that includes a source region 12, a drain region 14 and a fin-shaped channel region 16. The source 12, drain 14 and channel 16 regions are formed of a monolithic silicon body that is patterned from a silicon layer provided on a dielectric substrate 18. After patterning the silicon body, a gate oxide is grown or deposited over the silicon body, and then a conductive gate 20 as shown in FIG. 1b is patterned so as to surround the channel region 16. The gate 20 is patterned from a conductive material such as polysilicon. FIG. 2 shows a view of a cross-section of the gate and channel region of the FinFET of FIG. 1b taken at line A-A'. As seen in FIG. 2, the gate 20 and channel region 16 are separated by the gate oxide 22, and the gate 20 surrounds the channel region 16 on both of its sidewalls, thus serving as a double gate that imparts gate voltage to both sides of the channel region 16. The channel width of a FinFET is therefore approximately double the height of the channel region fin, enabling a high driving current compared to semiconductor substrate MOSFETs of comparable size.

While the conventional FinFET provides the aforementioned advantages over MOSFETs formed on semiconductor substrates due to its SOI construction, some fundamental characteristics of the FinFET such as carrier mobility are the same as those of other MOSFETs because the FinFET source, drain and channel regions are typically made from conventional MOSFET semiconductor materials such as silicon.

SUMMARY OF THE INVENTION

It is therefore an object of the invention to provide a FinFET device that improves over conventional FinFETs by enhancing characteristics of the device such as carrier mobility.

In accordance with embodiments of the invention, a FinFET body is patterned from a layer of silicon germanium (SiGe) that overlies a dielectric layer. An epitaxial layer of strained silicon is then formed on the Silicon germanium FinFET body. A tensile strain is imparted to the epitaxial silicon as a result of differences in the dimensionalities of a relaxed intrinsic silicon lattice and the silicon germanium crystal lattice that serves as the template on which the epitaxial silicon is grown. Strained silicon has an increased carrier mobility compared to relaxed silicon, and as a result the epitaxial strained silicon provides increased carrier mobility in the FinFET body. A higher driving current can therefore be realized in a FinFET employing a strained silicon channel layer.

In accordance with one embodiment of the invention, a silicon on insulator MOSFET device comprises a substrate comprising a dielectric layer. A FinFET body is formed on the dielectric layer. The FinFET body is typically silicon germanium. The FinFET body includes source and drain regions that have a channel region extending therebetween. A layer of strained silicon is formed on the surfaces of at least the channel region. A gate insulating layer is formed over at least the channel region to cover the strained silicon formed on surfaces of the channel region. A conductive gate surrounds the sidewalls and the top portion of the channel region and is separated from the channel region by the gate insulating layer and the strained silicon.

In accordance with another embodiment of the invention, a silicon on insulator MOSFET device is formed by initially providing a SOI substrate that includes a semiconductor layer overlying a dielectric layer. The semiconductor layer is typically silicon germanium. The semiconductor layer is patterned to form a FinFET body that includes source and drain regions and a channel region extending therebetween. A layer of strained silicon is then formed on the surfaces of at least the channel region. A gate insulating layer is formed over at least the strained silicon grown on the channel region to cover the strained silicon grown on the channel region. A conductive gate is then formed. The conductive gate surrounds sidewalls and a top portion of the channel region and is separated from the channel region by the gate insulating layer and the strained silicon.

In accordance with further alternatives, multiple FinFETs as described above may be combined to form CMOS devices, and FinFET bodies may be formed to have multiple channel-regions to thereby provide greater channel width.

DESCRIPTION OF THE DRAWINGS

Embodiments of the invention are described in conjunction with the appended drawings, in which:

FIG. 1b shows a gate portion formed over the body portion of the conventional FinFET of FIG. 1a;

FIG. 2 shows a cross section of a conventional FinFET gate and channel taken along line A-A' of FIG. 1a;

DESCRIPTION OF PREFERRED EMBODIMENTS

Figure 3:
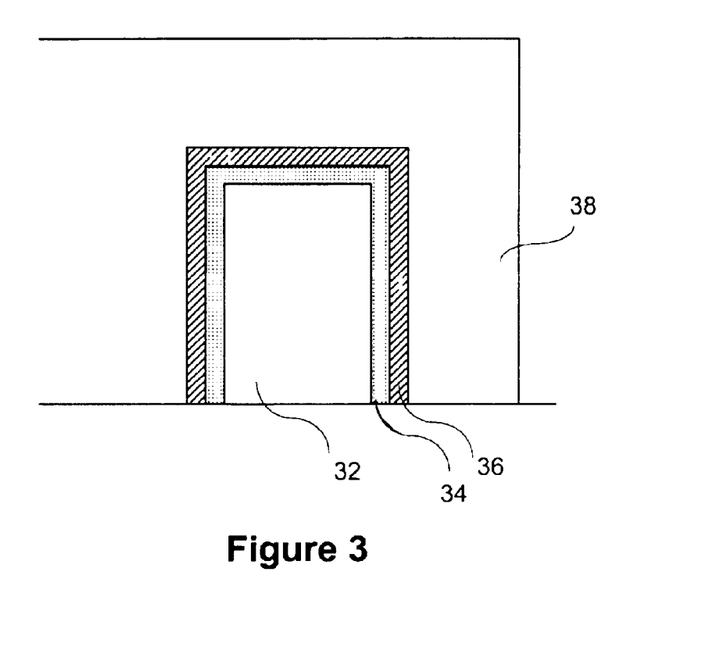
FIG. 3 shows a cross section of a FinFET gate and channel of a FinFET formed in accordance with an embodiment of the present invention.

A cross section of a gate and a channel region of a FinFET formed in accordance with an embodiment of the present invention is shown in FIG. 3. As seen in FIG. 3, the structure comprises a silicon germanium channel region 32 on which is grown an epitaxial layer of strained silicon 34. The silicon germanium lattice of the silicon germanium channel region 32 is generally more widely spaced than an intrinsic silicon lattice as a result of the presence of the larger germanium atoms in the lattice. Because the atoms of the silicon lattice align with the more widely spread silicon germanium lattice, a tensile strain is created in the silicon layer. The silicon atoms are essentially pulled apart from one another. The amount of tensile strain applied to the silicon lattice increases with the proportion of germanium in the silicon germanium lattice. As a result, the epitaxial silicon layer 34 grown on the silicon germanium channel region 32 is subjected to a tensile strain. The application of tensile strain to the silicon lattice causes four of its six silicon valence bands to increase in energy and two of its valence bands to decrease in energy. As a result of quantum effects, electrons effectively weigh 30 percent less when passing through the lower energy bands of strained silicon. Thus the lower energy bands offer less resistance to electron flow. In addition, electrons encounter less vibrational energy from the nucleus of the silicon atom, which causes them to scatter at a rate of 500 to 1000 times less than in relaxed silicon. As a result, carrier mobility is dramatically increased in strained silicon as compared to relaxed silicon, offering a potential increase in mobility of 80% or more for electrons and 20% or more for holes. The increase in mobility has been found to persist for current fields of up to 1.5 megavolts/centimeter. These factors are believed to enable a device speed increase of 35% without further reduction of device size, or a 25% reduction in power consumption without a reduction in performance.

As further shown in FIG. 3, a gate insulating layer 36 is formed over the strained silicon layer 34, and a double gate structure 38 is formed around the channel portion 32 overlying the gate insulating layer 36.

Thus the structure shown in FIG. 3 forms part of a FinFET that exhibits enhanced carrier mobility as the result of the strained silicon layer provided at the surface of the channel region as well as the source and drain regions. The aspect ratio of the cross section of the channel portion is probably as high as possible so as to form a tall, narrow channel region that is fully depleted and provides a maximum effective channel width.

Figure 4A:
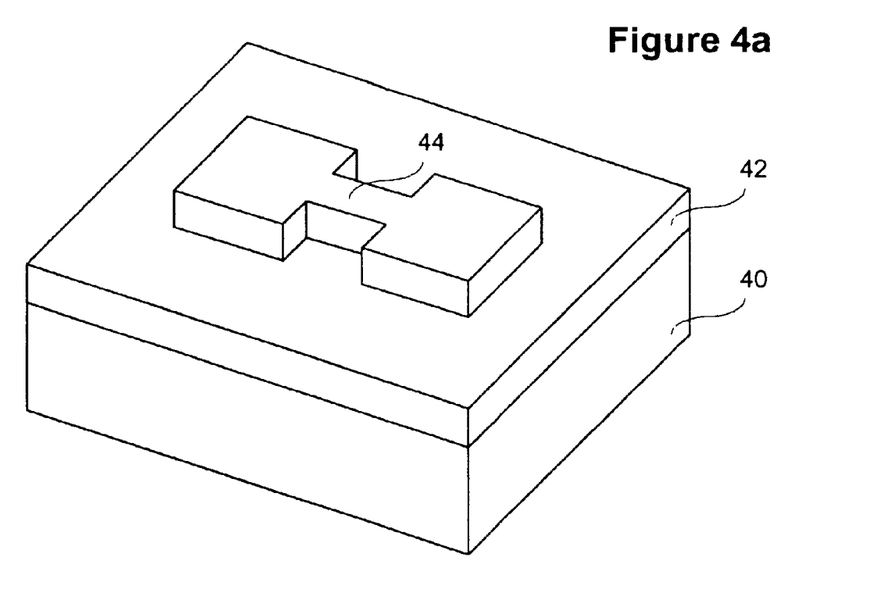
FIG. 4a shows a substrate and mask for forming a FinFET in accordance with an embodiment of the invention.
Figure 4B:
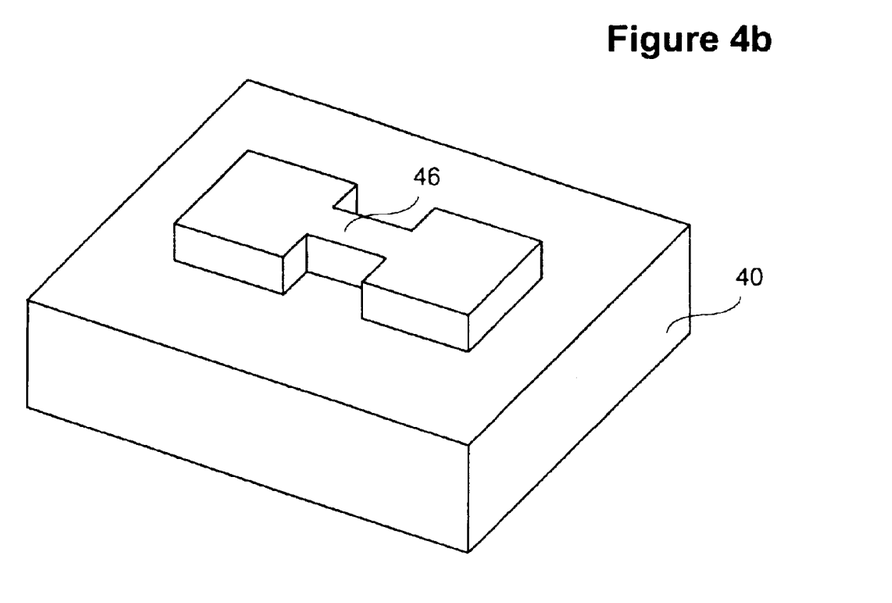
FIG. 4b shows the structure of FIG. 4a after etching of the substrate to form a FinFET body.
Figure 4C:
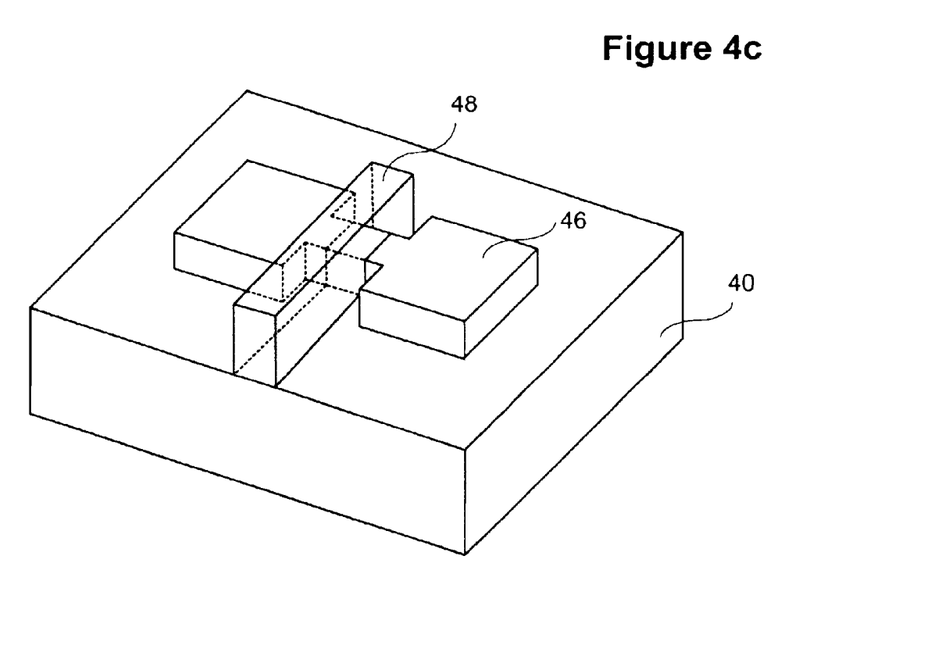
FIG. 4c shows the structure of FIG. 4b after formation of a gate.

A process for forming a FinFET in accordance with a preferred embodiment of the invention is now described with reference to FIGS. 4a–4c FIG. 4a shows a SOI substrate including a dielectric layer 40 and a relaxed silicon germanium layer 42. Various manners for producing such a substrate are discussed below. The silicon germanium layer 42 preferably has a composition $Si_{1-x}Ge_x$, where x is approximately 0.2, and is more generally in the range of 0.1–0.3.

A mask 44 is formed on the silicon germanium layer 42 for etching the silicon germanium layer 42. The mask is preferentially a hardmask formed by etching of a bi-layer structure using a photoresist mask of similar shape as an etch mask.

FIG. 4b shows the structure of FIG. 4a after etching using the mask 44 as an etch mask to remove unmasked silicon germanium and to thereby form a silicon germanium FinFET body 46.

An epitaxial strained silicon layer is then formed by selective growth on the silicon germanium FinFET body 46. The strained silicon layer is preferably grown by chemical vapor deposition (CVD) using $Si_2H_6$ as a source gas with a partial pressure of 30 mPa and a substrate temperature of approximately 600–900 degrees C. The epitaxial silicon layer is strained upon its formation as the result of forces within the silicon lattice created as the result of alignment of the silicon atoms through bonding to corresponding atoms of the silicon germanium lattice. In preferred embodiments, the epitaxial strained silicon has a thickness of 100–200 Angstroms.

After growth of the strained silicon layer, a gate insulating layer of silicon oxide is formed over the layer of strained silicon. The silicon oxide may be formed by deposition or may be selectively grown from the strained silicon layer. The final thickness of the strained silicon layer is preferably approximately 80–200 A. Therefore, the amount of strained silicon that is initially grown will be determined in part based on whether some of the strained silicon will be consumed during oxide growth.

After formation of the gate insulating layer, a gate 48 is formed, yielding the structure illustrated in FIG. 4c. The gate is preferably formed by deposition of a conformal layer of polysilicon over the substrate including the silicon germanium FinFET body 46, followed by planarization of the polysilicon layer and then patterning using an etch mask to define a gate 48 as shown in FIG. 4c.

Following patterning of the gate 48, further processing may be performed such as formation of insulating spacers on sidewalls of the gate, implantation of dopant in the source and drain regions, formation of source, drain and gate silicides, and formation of a protective layer around the FinFET.

Figure 8:
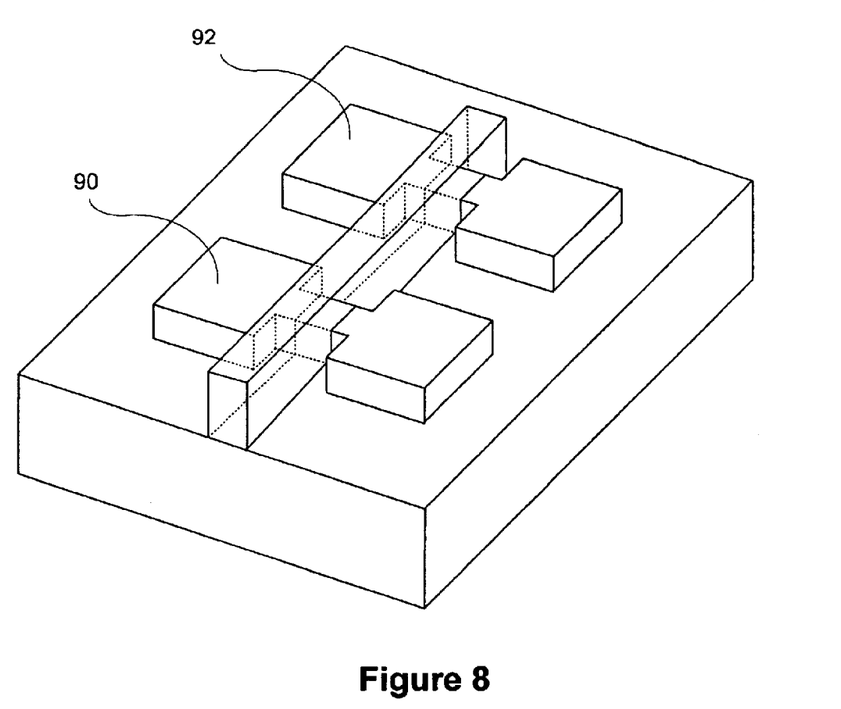
FIG. 8 shows a CMOS device formed of two FinFET structures in accordance with an embodiment of the invention.
Figure 9:
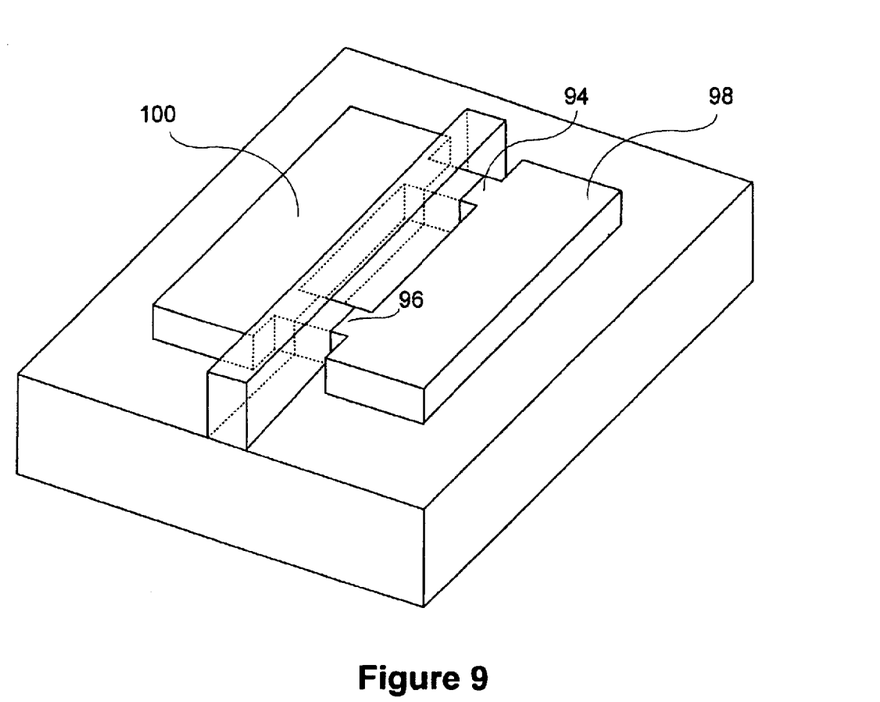
FIG. 9 shows a FinFET having multiple channel regions extending between the source and drain regions in accordance with an embodiment of the invention.

While the process described with reference to FIGS. 4a–4c concerns the formation of a single FinFET, it should be understood that a variety of alternative structures may be implemented using similar processing. For example, in one alternative implementation, a pair of FinFETs that are doped with respective complementary dopants may have gates that are electrically connected to thereby constitute a CMOS FinFET. FIG. 8 shows an example of such a CMOS structure comprised of two FinFETs 90 and 92. In another alternative implementation, the source and drain regions of the FinFET may be connected by multiple channel regions that extend between them, thus providing greater surface area contact between the channel regions and the gate and have greater channel width. FIG. 9 shows an example of such a FinFET structure comprised of two separate channel regions 94 and 96 that join source and drain regions 98, 100.

Figure 5A:
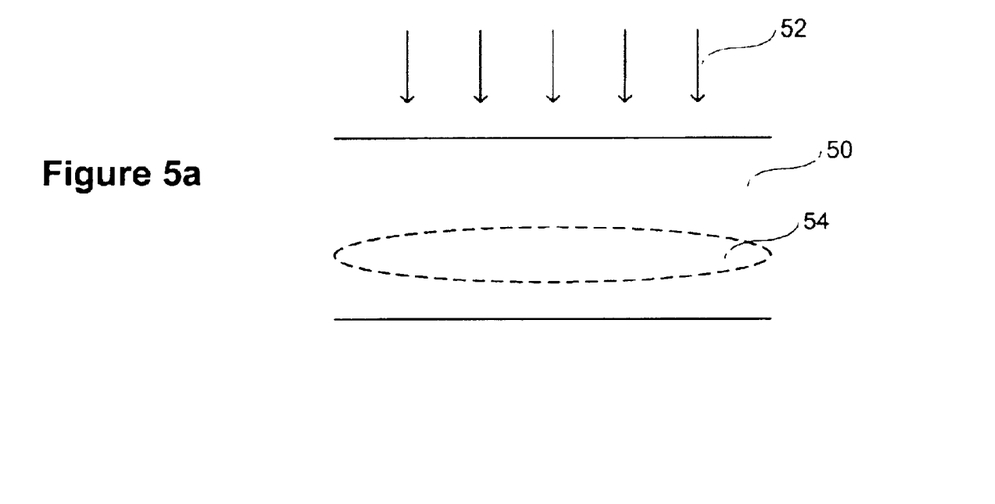
FIG. 5a shows the implantation of oxygen into a silicon germanium substrate.
Figure 5B:
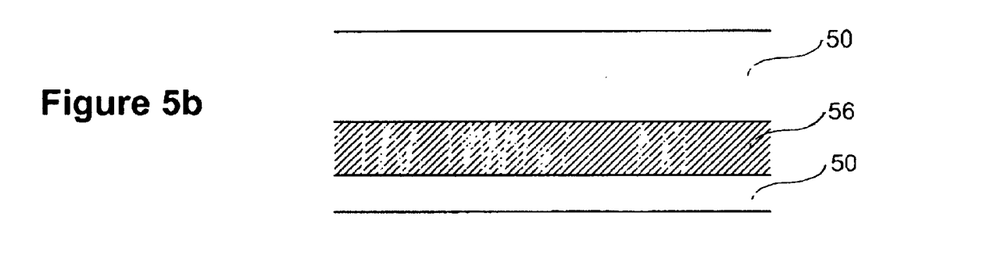
FIG. 5b shows the structure of FIG. 5a after annealing to form a buried oxide (BOX) layer of a silicon germanium SOI substrate.
Figure 5C:
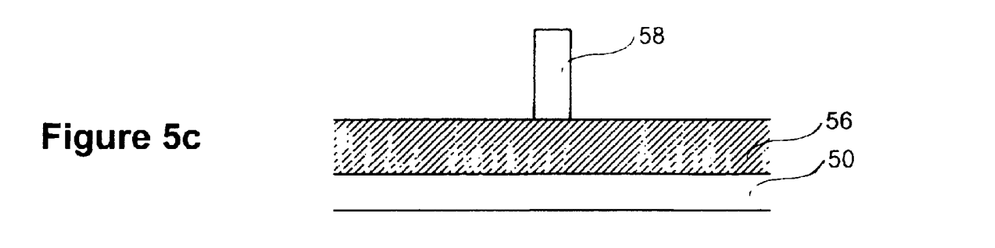
FIG. 5c shows the structure of FIG. 5b after patterning of a FinFET body from a silicon germanium layer.

The silicon germanium SOI substrate may be provided in a variety of manners. FIGS. 5a, 5b and 5c show structures formed using implanted oxygen to form a buried oxide (BOX) layer in a silicon germanium substrate. As shown in FIG. 5a, a silicon germanium substrate 50 is provided. The substrate typically comprises a layer of silicon germanium grown on a silicon wafer. Silicon germanium may be grown, for example, by chemical vapor deposition using disilane ($Si_2H_6$) and germane ($GeH_4$) as source gases, with a substrate temperature of 600–90 degrees C., a $Si_2H_6$ partial pressure of 30 mPa, and a $GeH_4$ partial pressure of 60 mPa. Growth of the silicon germanium material may be initiated using these ratios, or alternatively the partial pressure of $GeH_4$ may be gradually increased beginning from a lower pressure or zero pressure to form a gradient composition. The thickness of the silicon germanium layer may be determined in accordance with the particular application. Preferably the portion of the silicon germanium layer to be used for forming the FinFET body should have a uniform composition.

As shown in FIG. 5a, the silicon germanium substrate 50 is implanted with oxygen 52 at an energy sufficient to form an oxygenated region 54 at such a depth to leave a required thickness of silicon germanium above the oxygenated region.

FIG. 5b shows the structure of FIG. 5a after annealing of the silicon germanium substrate 50 to form a buried silicon germanium oxide layer 56 within the substrate. Annealing is typically performed at approximately 1350 degrees C. for approximately four hours, and typically serves to relax any residual strain in the silicon germanium lattice. The oxide layer 56 serves as the dielectric layer on which monolithic FinFET bodies are later formed, as described above. FIG. 5c shows the structure of FIG. 5b after patterning a silicon germanium FinFET body 58 (shown in cross section at the channel region) from the silicon germanium layer that overlies the oxide layer 56.

Figure 6A:
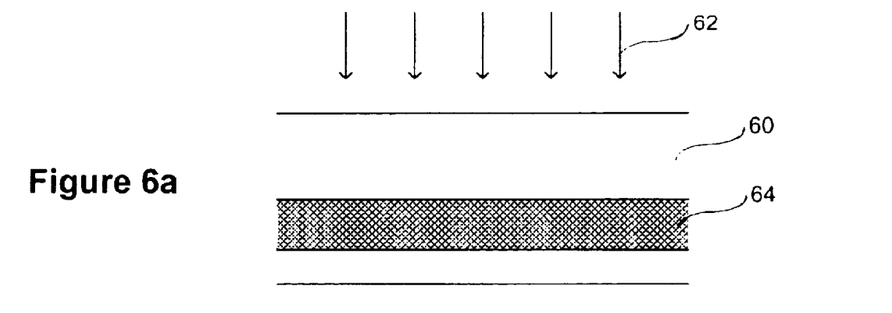
FIG. 6a shows the implantation of hydrogen into a silicon germanium substrate.
Figure 6B:
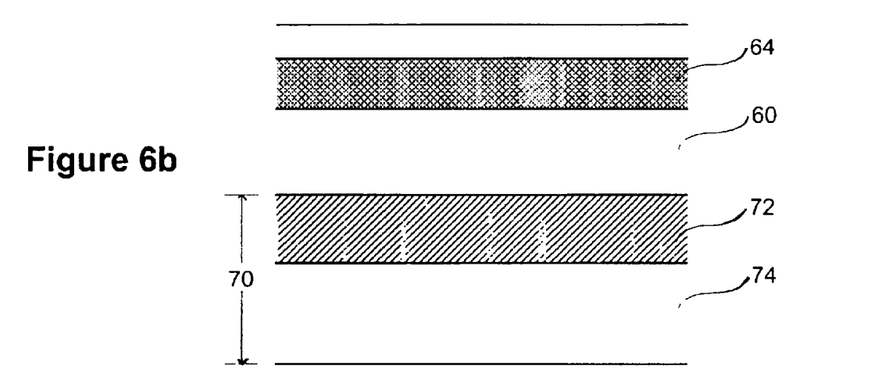
FIG. 6b shows the structure of FIG. 6a after being inverted and bonded to an oxide layer of a second substrate.

FIGS. 6a–6d shows structures formed in accordance with a second method for forming a silicon germanium SOI substrate. FIG. 6a shows a planarized silicon germanium substrate 60. The substrate 60 is implanted with hydrogen 62 to form a hydrogen rich region 64 within the silicon germanium material. The hydrogen 62 is implanted with an energy such that the amount of silicon germanium remaining above the hydrogen rich region exceeds the thickness of the silicon germanium layer to be formed on the SOI substrate. It may be preferred to implant the hydrogen into a strained region of the silicon germanium FIG. 6b shows the silicon germanium substrate of FIG. 6a after being cleaned, stripped of oxide in a diluted HF solution, rinsed in deionized water to form an active native oxide on its surface, and then inverted and bonded to a planarized oxide layer 72 formed on a semiconductor layer 74 of second substrate 70. Bonding may be performed at room temperature, and requires precise planarization of both substrates to provide maximum surface contact for optimal bonding.

Figure 6C:
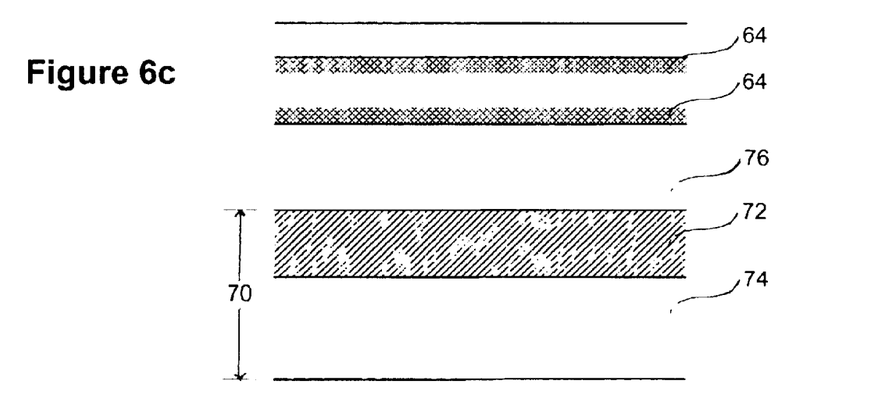
FIG. 6c shows the structure of FIG. 6b after annealing to fracture the first substrate in the region of implanted hydrogen.

After bonding, the bonded substrates are annealed, for example at a temperature of 600 degrees C. for approximately three hours. As shown in FIG. 6c, annealing causes the silicon germanium substrate to fracture along the hydrogen rich region 64, thus leaving a new substrate comprising a silicon germanium layer 76 bonded to an oxide layer 72, and having a residual hydrogen rich region 64 at its upper surface.

Figure 6D:
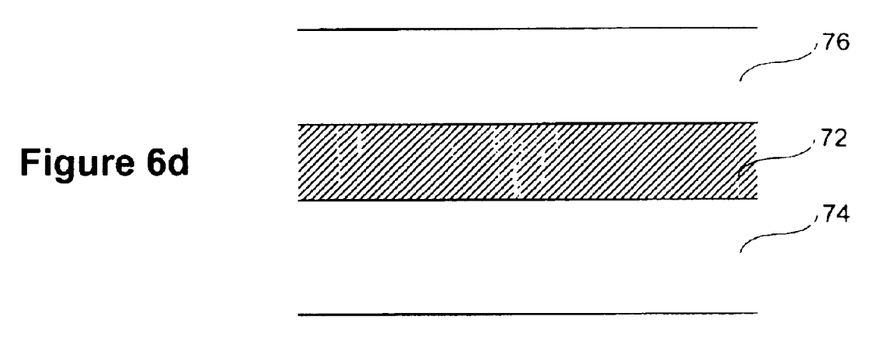
FIG. 6d shows the structure of FIG. 6c after planarization to yield a silicon germanium SOI substrate.

The new substrate is subsequently planarized and cleaned, leaving a silicon germanium SOI substrate as shown in FIG. 6d, from which a silicon germanium FinFET body may be patterned as described previously.

Figure 7:
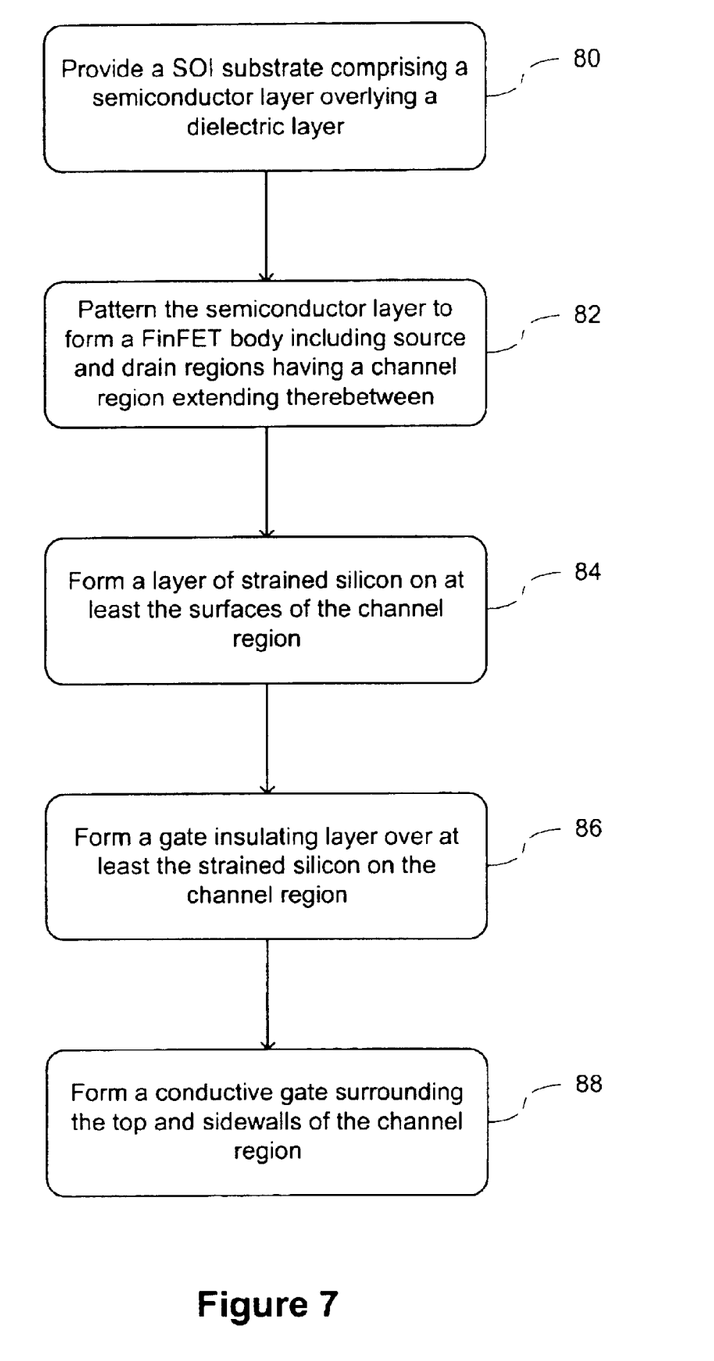
FIG. 7 shows a process flow encompassing the preferred embodiment and alternative embodiments.

FIG. 7 illustrates a process flow encompassing the preferred embodiment, the aforementioned alternatives and various other alternatives for forming a SOI MOSFET device. Initially a SOI substrate is provided (80). The SOI substrate comprises a semiconductor layer that overlies a dielectric layer. The semiconductor layer is preferably silicon germanium and the dielectric layer is preferably silicon germanium oxide or silicon oxide. The semiconductor layer is then patterned to form a FinFET body comprising source and drain regions having a channel region extending therebetween (82). A layer of strained silicon is then formed on surfaces of at least the channel region (84), although the layer of strained silicon may additionally be formed over the surfaces of the entire FinFET body. A gate insulating layer is formed over at least the strained silicon grown on the channel region of the FinFET body to cover the strained silicon grown on the channel region (86). The gate insulating layer may be an oxide grown from the strained silicon or may be deposited over the strained silicon. A conductive gate is then formed (88). The gate surrounds sidewalls and a top portion of the channel region and is separated from the channel region by the gate insulating layer and the strained silicon layer. As mentioned above, a variety of structural implementations may be formed using this process flow, including the single device shown in FIGS. 4a–4c, as well as CMOS devices, devices having multiple channel regions, and devices employing varying material compositions and material layer structures.

In addition, FinFET structures incorporating strained silicon as described herein may also be formed by alternative methods, such as growth of a silicon germanium layer on a semiconductor FinFET body, or implantation of germanium into a silicon FinFET body, followed by growth of strained silicon on the silicon germanium lattice at the surface of the FinFET body. Further, the strained silicon may be formed by implantation of carbon into the surface of a silicon FinFET body. Therefore, strained silicon FinFETs in accordance with the invention may be generally characterized as comprising a layer of strained silicon formed on at least the channel region of a FinFET body. Typically the FinFET body comprises a layer of silicon germanium at the surface of at least its channel region.

In further alternatives, the strain in a semiconductor layer may be enhanced by implanting germanium into the supporting oxide layer to expand the oxide layer. In other alternatives, a high k material having a lattice spacing to that of silicon germanium may be used as the gate insulating layer to provide additional support for the strain in the strained silicon layer.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counter-doping, cleaning, planarization, and other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A silicon on insulator (SOI) MOSFET device comprising:
   a substrate comprising a dielectric layer;
   a FinFET body formed on the dielectric layer, the FinFET body comprising source and drain regions having a channel region extending therebetween;
   a layer of strained silicon formed on surfaces of at least the channel region of the FinFET body;
   a gate insulating layer formed over at least the channel region to cover the strained silicon formed on surfaces of the channel region; and
   a conductive gate that surrounds sidewalls and a top portion of the channel region and that is separated from the channel region by the gate insulating layer and the strained silicon layer,
   wherein the FinFET body comprises at least first and second channel regions extending between the source and drain regions.

2. The device claimed in claim 1, wherein the FinFET body has silicon germanium at at least a surface of the channel region.

3. The device claimed in claim 2, wherein the silicon germanium FinFET body has a composition $Si_{1-x}Ge_x$ where x is in the range of 0.1 to 0.3.

4. The device claimed in claim 3, wherein x is approximately 0.2.

5. The device claimed in claim 1, wherein the FinFET body is silicon germanium.

6. The device claimed in claim 1, wherein the FinFET body comprises a first FinFET body, and wherein the device further comprises:
   a second FinFET body formed on the dielectric layer, the second FinFET body comprising second source and drain regions having a second channel region extending therebetween;
   a layer of strained silicon formed on surfaces of the second channel region;
   a gate insulating layer formed over at least the second channel region to cover the strained silicon formed on surfaces of the second channel region; and
   a second conductive gate that surrounds sidewalls and a top portion of the second channel region and that is separated from the second channel region by the gate insulating layer and the strained silicon layer, and that is electrically connected to the conductive gate surrounding the channel region of the first FinFET body,
   the source and drain of the first FinFET body being doped with a first dopant, and the source and drain of the second FinFET body being doped with a second dopant complementary to the first dopant.

7. The device claimed in claim 1, wherein the gate insulating layer comprises a silicon oxide grown from the strained silicon layer.

8. The device claimed in claim 1, wherein the strained silicon layer covers the source and drain regions of the FinFET body.

9. The device claimed in claim 1, further comprising a spacer formed on sidewalls of the conductive gate.

10. The device claimed in claim 1, wherein the dielectric layer comprises a silicon germanium oxide.

11. A silicon on insulator (SOI) MOSFET device comprising:
    a substrate comprising a dielectric layer;
    a FInFET body formed on the dielectric layer, the FinFET body comprising source and drain regions having a channel region extending therebetween;
    a layer of strained silicon formed on surfaces of at least the channel region of the FinFET body;
    a gate insulating layer formed over at least the channel region to cover the strained silicon formed on surfaces of the channel region;
    a conductive gate that surrounds sidewalls and a top portion of the channel region and that is separated from the channel region by the gate insulating layer and the strained silicon layer; and
    a spacer formed on sidewalls of the conductive gate.

12. The device claimed in claim 11, wherein the FinFET body has silicon germanium at at least a surface of the channel region.

13. The device claimed in claim 12, wherein the silicon germanium FinFET body has a composition $Si_{1-x}Ge_x$ where x is in the range of 0.1 to 0.3.

14. The device claimed in claim 13, wherein x is approximately 0.2.

15. The device claimed in claim 11, wherein the FinFET body comprises at least first and second channel regions extending between the source and drain regions.

16. The device claimed in claim 11, wherein the FinFET body is silicon germanium.

17. The device claimed in claim 11, wherein the FinFET body comprises a first FinFET body, and wherein the device further comprises:
    a second FinFET body formed on the dielectric layer, the second FinFET body comprising second source and drain regions having a second channel region extending therebetween;
    a layer of strained silicon formed on surfaces of the second channel region;

a gate insulating layer formed over at least the second channel region to cover the strained silicon formed on surfaces of the second channel region; and a second conductive gate that surrounds sidewalls and a top portion of the second channel region and that is separated from the second channel region by the gate insulating layer and the strained silicon layer, and that is electrically connected to the conductive gate surrounding the channel region of the first FinFET body, the source and drain of the first FinFET body being doped with a first dopant, and the source and drain of the second FinFET body being doped with a second dopant complementary to the first dopant.

18. The device claimed in claim 11, wherein the gate insulating layer comprises a silicon oxide grown from the strained silicon layer.

19. The device claimed in claim 11, wherein the strained silicon layer covers the source and drain regions of the FinFET body.

20. The device claimed in claim 11, wherein the dielectric layer comprises a silicon germanium oxide.

21. A silicon on insulator (SOI) MOSFET device comprising:

a substrate comprising a dielectric layer;

a FinFET body formed on the dielectric layer, the FinFET body comprising source and drain regions having a channel region extending therebetween;

a layer of strained silicon formed on surfaces of at least the channel region of the FinFET body;

a gate insulating layer formed over at least the channel region to cover the strained silicon formed on surfaces of the channel region; and a conductive gate that surrounds sidewalls and a top portion of the channel region and that is separated from the channel region by the gate insulating layer and the strained silicon layer, wherein the dielectric layer comprises a silicon germanium oxide.

22. The device claimed in claim 21, wherein the FinFET body has silicon germanium at at least a surface of the channel region.

23. The device claimed in claim 22, wherein the silicon germanium FinFET body has a composition $Si_{1-x}Ge_x$ where x is in the range of 0.1 to 0.3.

24. The device claimed in claim 23, wherein x is approximately 0.2.

25. The device claimed in claim 21, wherein the FinFET body comprises at least first and second channel regions extending between the source and drain regions.

26. The device claimed in claim 21, wherein the FinFET body is silicon germanium.

27. The device claimed in claim 21, wherein the FinFET body comprises a first FinFET body, and wherein the device further comprises:

a second FinFET body formed on the dielectric layer, the second FinFET body comprising second source and drain regions having a second channel region extending therebetween;

a layer of strained silicon formed on surfaces of the second channel region;

a gate insulating layer formed over at least the second channel region to cover the strained silicon formed on surfaces of the second channel region; and a second conductive gate that surrounds sidewalls and a top portion of the second channel region and that is separated from the second channel region by the gate insulating layer and the strained silicon layer, and that is electrically connected to the conductive gate surrounding the channel region of the first FinFET body, the source and drain of the first FinFET body being doped with a first dopant, and the source and drain of the second FinFET body being doped with a second dopant complementary to the first dopant.

28. The device claimed in claim 21, wherein the gate insulating layer comprises a silicon oxide grown from the strained silicon layer.

29. The device claimed in claim 21, wherein the strained silicon layer covers the source and drain regions of the FinFET body.

30. The device claimed in claim 21, further comprising a spacer formed on sidewalls of the conductive gate.

* * * * *